United States Patent [19]

Shiba

[11] 4,063,901
[45] Dec. 20, 1977

[54] METHOD OF MANUFACTURING A SEMICONDUCTOR DEVICE

[75] Inventor: Hiroshi Shiba, Tokyo, Japan

[73] Assignee: Nippon Electric Company, Ltd., Tokyo, Japan

[21] Appl. No.: 782,418

[22] Filed: Mar. 29, 1977

[30] Foreign Application Priority Data

Mar. 31, 1976 Japan .................................. 51-35824

[51] Int. Cl.² ............................................. B01J 17/00
[52] U.S. Cl. ..................................... 29/578; 148/188
[58] Field of Search .................. 148/187, 188; 29/576, 29/578, 591; 357/59

[56] References Cited
U.S. PATENT DOCUMENTS 3,600,651  8/1971  Duncan ................................. 357/59

Primary Examiner—Gerald A. Dost
Attorney, Agent, or Firm—Hopgood, Calimafde, Kalil, Blaustein & Lieberman

[57] ABSTRACT

A method of manufacturing a semiconductor device is disclosed, in which a polycrystalline silicon layer is formed over a semiconductor substrate coated with an insulating layer with a window and a first kind of impurity is doped to a first predetermined portion of the polycrystalline silicon layer to a depth at least reaching the surface of the semiconductor substrate. Then a peripheral of the doped portion of the polycrystalline silicon layer is converted into an insulator, and a second kind of impurity is doped into a second predetermined portion of the polycrystalline silicon layer to a depth at least reaching the surface of the semiconductor substrate, thereby providing electrode wiring paths including the first and second predetermined portions.

7 Claims, 24 Drawing Figures

METHOD OF MANUFACTURING A SEMICONDUCTOR DEVICE

DETAILED DESCRIPTION OF THE INVENTION:

This invention relates to a method of manufacturing a semiconductor device, and more particularly to a method of manufacturing a supersmall-sized semiconductor device.

In the prior art manufacturing technology of a semiconductor device, much effort has been made for improvements in the high frequency characteristic of the semiconductor device. Decreasing a junction area for reducing parasitic capacitance thereof and minimizing a distance between the junctions for reducing parasitic electrical resistance therebetween are examples of the efforts. However according to the prior art, a certain marginal distance is required to be provided between different patterns such as electrode patterns, wiring patterns, diffused region patterns for their relative positional alignment, in addition to a minimum spacing which is determined by a manufacturing accuracy information of the patterns per se. As a result, a junction area and distance between a junction and an electrode are increased, as compared with a possible minimum.

It is an object of the present invention to provide a method for manufacturing a small-sized semiconductor device with ease.

It is a further object of the present invention to provide a method for manufacturing a semiconductor device having an excellent high-frequency performances.

According to the method of the present invention, at first, a polycrystalline silicon layer is deposited over the major surface of a semiconductor substrate, a surface of which is selectively covered with an insulating layer. Then, a first kind of impurity is selectively doped into a predetermined area of the polycrystalline silicon layer to a depth reaching the interface between the silicon layer and the substrate, thereby providing a first impurity-doped region in the polycrystalline silicon layer. A peripheral portion of the first impurity-doped region is selectively converted into an insulator to its entire thickness. Thereafter, a second kind of impurity is doped into another predetermined area of the polycrystalline silicon layer to a depth reaching the surface of the substrate, thereby providing a second impurity-doped region therein. The first and second impurity-doped regions serve as electrode wiring paths respectively.

Figure 2A:
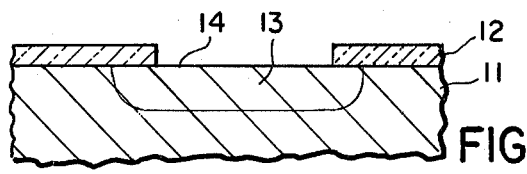
Figure 2B:
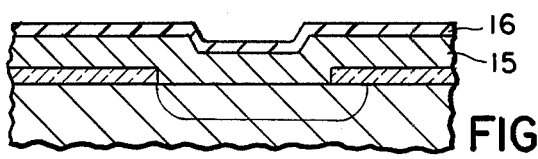
Figure 1A:
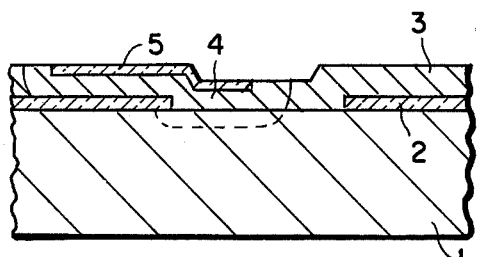
Figure 2C:
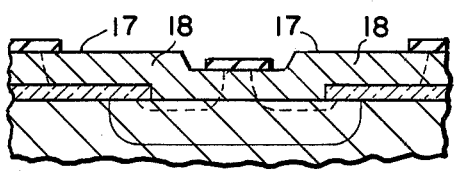
Figure 2D:
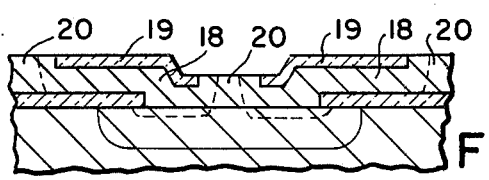
Figure 1B:
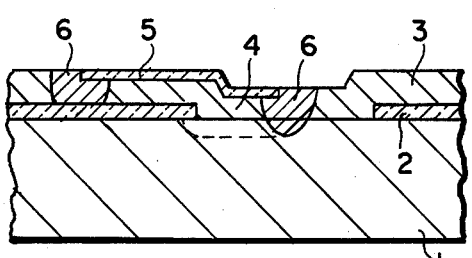
Figure 2E:
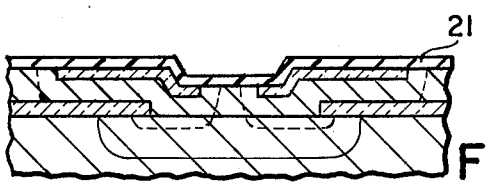
Figure 2F:
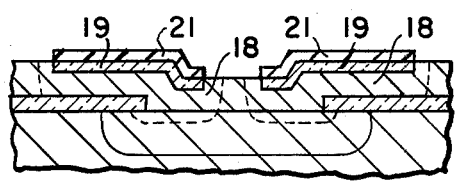
Figure 1C:
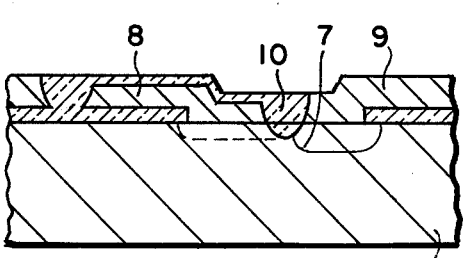
Figure 2G:
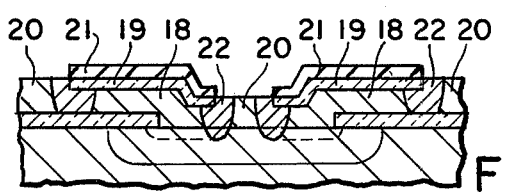
Figure 2H:
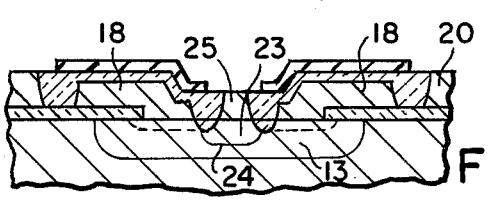
Figure 3A:
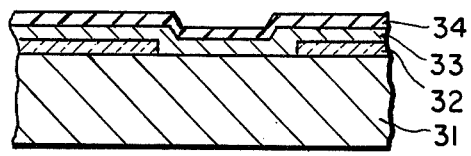
Figure 3B:
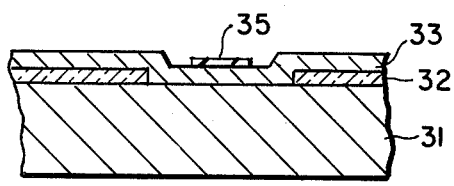
Figure 3C:
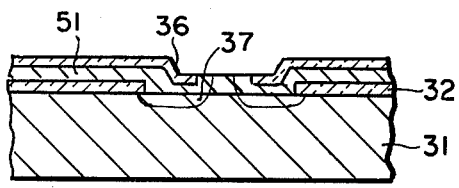
Figure 3B:
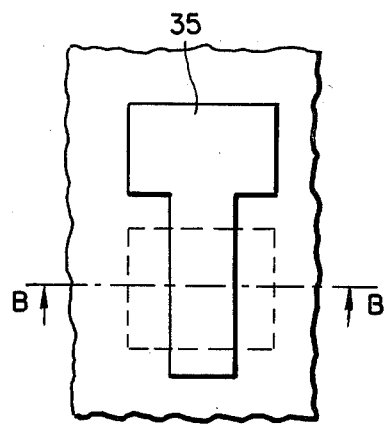
Figure 3D:
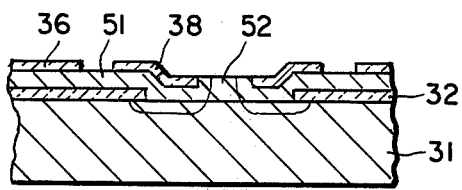
Figure 3E:
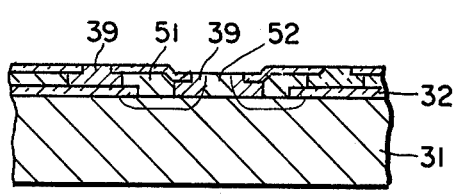
Figure 3D:
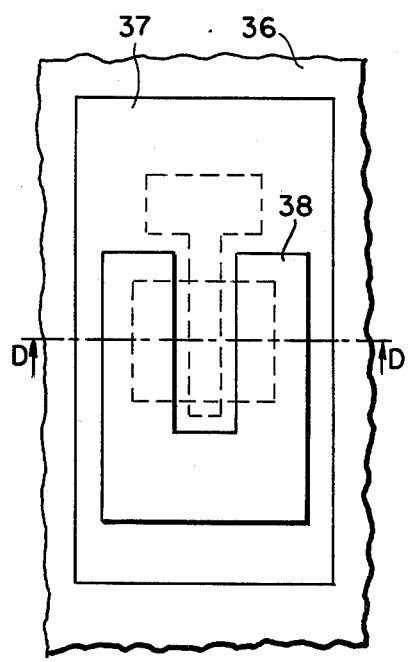
Figure 3F:
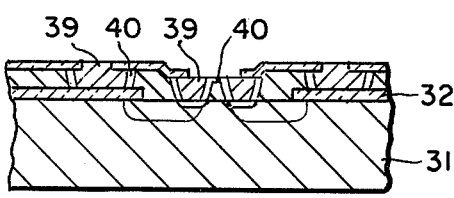
Figure 3G:
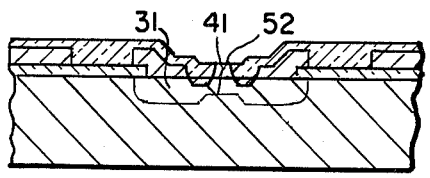
Figure 3H:
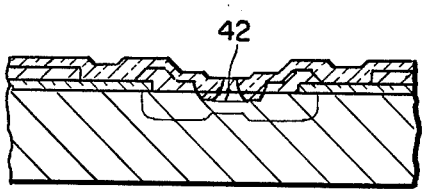
Figure 3I:
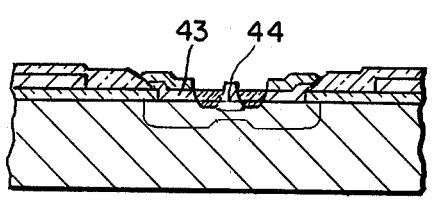
Figure 3J:
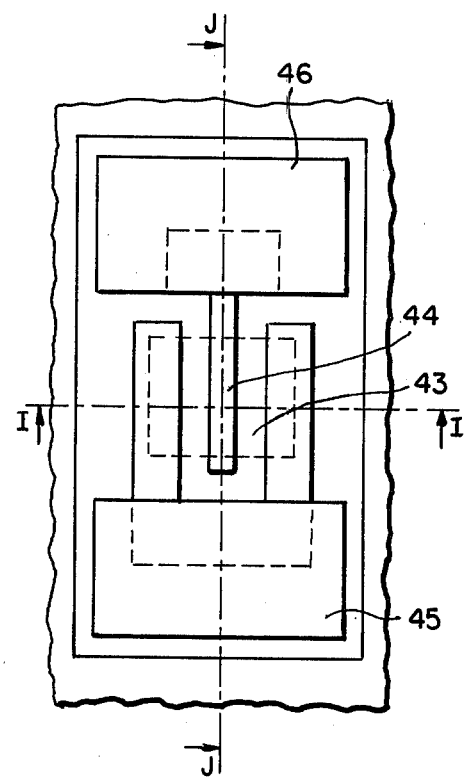
Figure 3J:
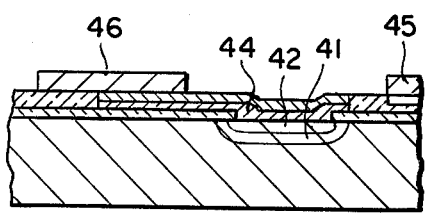

FIGS. 1(A) to 1(C) are cross sectional views illustrative of the principle of the manufacturing method according to the present invention;

FIGS. 2(a) to 2(H) are cross sectional views illustrative of the steps of a manufacturing process according to one embodiment of the present invention; and FIGS. 3(A) to 3(J) are cross sectional views illustrative of the steps of the manufacturing process according to another embodiment of the present invention; which FIGS. 3(B'), 3(D') and 3(J') are plan views, FIGS. 3(B) and 3(D) are cross sections along the lines B—B of FIG. 3(B') and D—D of FIG. 3(D'), respectively, and FIGS. 3(I) and (J) are corss sections along the lines I—I and J—J', respectively, of FIG. 3(J').

According to the present invention, there is provided a semiconductor device, in which, as shown in FIG. 1(C), a PN junction 7 is provided in a semiconductor single crystal substrate 1, and electrode wiring paths 8, 9 are provided in a polycrystalline silicon layer and are separated by an insulating region 10. The wiring paths 8, 9 have non-rectifying contacts to the single crystalline regions of the substrate which are separated by the PN junction 7. In addition, the semiconductor device presents a substantially flat surface which protects the device from mechanical damage and facilitates a multi-layer wiring interconnection structure.

According to the present invention, the electrode wiring paths 8, 9 and the PN junction 7 can be essentially made from a single photoresist operation. Namely, the PN junction 7 can be made together with the wiring path 9 by self-aligning. Therefore, any additional destance required for a relative positional alignment of one pattern to another can be eliminated or can be decreased to a minimum. As a result, a super small-slized, high performance semiconductor device can be gained with ease.

A principle incorporated in the present invention will be described with reference to FIGS. 1(A) to I(C). A polycrystalline silicon layer 3 is formed over a main surface of a semiconductor single crystal substrate 1 which is coated with an insulating layer 2 having an opening or a window. Then, a first kind of impurity is diffused into a desired area of the polycrystalline silicon layer 3 down to the interface between the polycrystalline silicon layer 3 and the substrate 1, thereby forming an impurity doped region 4, while a first insulating layer 5 is left over a predetermined portion of the polycrystalline silicon layer 3 which nearly corresponds to the mentioned desired area or is within the desired area. In this stage, the doped region 4 is somewhat enlarged, as compared with the aforesaid desired portion due to the thermal diffusion of the impurity (FIG. 1A). Then, an exposed portion of the impurity doped region 4, i.e., a portion not covered with the first insulating layer 5 of the impurity-doped region 4, is selectively converted into an insulating material 6 down to the interface between the polycrystalline silicon layer 3 and the substrate 1, by utilizing a difference in electrical or chemical property between the impurity-doped silicon and the non-doped silicon (FIG. 1B). Then a second impurity is diffused into the non-dopped region in the polycrystalline silicon layer to a depth exceeding the interface between the polycrystalline silicon layer 3 and the substrate 1, thereby providing a PN Junction 7 and electrode wiring paths 8, 9 separated each other by the insulating material 10 and a PN junction 7, at the same time (FIG. 1C).

Referring to FIGS. 2(A) to 2(H), a method of manufacturing a bipolar transistor according to one embodiment of the present invention will be described. At first, a P-type semiconductor region 13 (base region) is formed in an N type semiconductor single crystal substrate 11 (a collector region) according to the standard selective diffusion technique, and then a desired portion of silicon oxide layer 12 covering the surface of the substrate 11 is removed, providing an opening 14 therein, through which is exposed a surface of the semiconductor substrate 11.(FIG. 2(A)). Then, a polycrystalline silicon layer 15 in a thickness of 0.5 micron and a silicon nitride layer 16 in a thickness of 0.1 micron are successively formed over the entire surface of the substrate by chemical vapour deposition technique.(FIG. 2(B)). Thereafter, a desired portion of the silicon nitride layer 16 is removed so as to form an opening 17, through which is exposed the surface of the polycrystalline silicon layer 15, and then boron is diffused therein through the opening 17 to a depth reaching the P type semiconductor region 13 according to a thermal diffusion process. In this case, boron is diffused both in the vertical direction and in the horizontal direction with respect to the surface of the polycrystalline silicon layer 15, so that a boron-diffused region 18 extends slightly beyond the contour of the opening 17. (FIG. 2(C)). A silicon oxide layer 19 is then formed over the exposed surface of the polycrystalline silicon layer 15 at the opening 17 to a thickness of 0.2 micron by a thermal oxidation treatment. Then the wafer is dipped into 70% phosphoric acid at 150° C for 30 minutes, thereby removing the silicon nitride layer. By this treatment, a non-doped polycrystalline silicon region 20 and a peripheral portion of the boron-diffused region 18, i.e., a portion of the region 18 which extends beyond the countour of the opening 17, are exposed. (FIG. 2(D)). A silicon nitride layer 21 is formed over the entire surface of the substrate to a thickness of 0.1 micron, by a chemical vapour deposition technique (FIG. 2(E)), after which the wafer is dipped into a forming solution (electrolyte) of ethylene glycol saturated with ammonium borate, and then a voltage of +200V is applied to the substrate for anodic oxidation for 30 minutes. This treatment converts a portion of the silicon nitride layer 21, which directly faces the polycrystalline silicon layer, into silicon oxide. Subsequent to the anodic oxidation, the wafer is dipped in a hydrofluoric acid solution to remove the silicon oxide, thereby exposing the surface of the polycrystalline silicon layer again. (FIG. 2(F)). Then, the wafer is dipped in a hydrofluoric acid solution, and a positive voltage is applied to the substrate for anodization treatment. As is well know, when silicon is subjected to the anodizations treatment in hydrofluoric acid, the silicon is converted into a porous silicon in proportion to the amount of electric current applied thereto. Meanwhile, the electric conductivity of non-dopped polycrystalline silicon is extremely low. As a result, the exposed peripheral portion of the region 18 is specifically anodized into a porous silicon due to an anodizing current concentrated in the boron-doped region 18. In this embodiment it is suggested that a constant current at a rate of 10 miliampers per square centimeter be applied for a period of one minute. According to this treatment, only the peripheral portion of the region 18 is converted into the porous silicon down to the surface of the substrate 11, while the other portion thereof remains non-porous. Although the silicon nitride layer slightly dissolves in the hydrofluoric acid, the masking function of the silicon nitride layer can be satisfactorily retained because the silicon nitride dissolves in the hydrofluoric acid at a rate of about 0.002 micron per minute. Then, the wafer is subjected to a thermal oxidation treatment, thereby converting the porous silicon region into a silicon oxide layer 22. By this oxidation treatment, a thin silicon oxide film is formed on the surface of the non-doped region 20, as well. The wafer is dipped in a hydrofluoric acid solution to remove the thin silicon oxide film, thereby exposing the surface of the silicon region 20. (FIG. 2(G)). Then, phosphorous is thermally diffused into the polycrystalline silicon region 20 and further into a part 23 of the semiconductor single crystal region contiguous thereto, thereby forming an emitter junction 24. (FIG. 2(H)). Thus, by the method described above, there is obtained an NPN transistor comprising the N type semiconductor substrate 11 as a collector, the P type semiconductor region 13 as a base, the N-type semiconductor region 23 as an emitter, the P-type polycrystalline silicon thin layer region 18 as a base electrode wiring path, and the N-type polycrystalline silicon thin layer region 25 as an emitter electrode wiring path. Finally, metallic electrode terminals for connecting with external leads are attached to desired portions of the P type and the N type polycrystalline silicon this layer regions.

Referring to FIGS. 3(A) to 3(J), another embodiment of the invention by which a bipolar transistor is produced will be described.

An opening is provided in a desired portion of an insulating layer 32 covering the main surfaces of an N type semiconductor single crystal substrate 31, through which a surface of the substrate 31 is exposed. Then, a polycrystalline silicon thin layer 33 in a thickness of 0.5 micron and a silicon nitride layer 34 in a thickness of 0.1 micron are successively formed over the entire surface of the substrate according to a chemical vapour deposition technique. (FIG. 3(A)). Then, a desired portion of the silicon nitride layer 34 is removed to leave a silicon nitride pattern 35 as a mask and to expose the surface of the polycrystalline silicon layer 33. (FIGS. 3(B), 3(B')). Then, as in the preceding embodiment, boron is diffused into the portion of the polycrystalline silicon layer not covered with the silicon nitride pattern 35 to a depth exceeding the surface of the N type semiconductor substrate 31 according to a thermal diffusion process, thereby providing a boron-diffused region 37 in the substrate 31. And then a silicon oxide layer 36 in a thickness of 0.3 micron is formed over the exposed surface of the polycrystalline silicon surface by a thermal oxidation treatment, after which the silicon nitride layer 35 is removed. (FIG. 3(C)). In this case, as in the preceding embodiment, boron is diffused also in the direction parallel with the surface of the substrate, so that the boron diffused region 51 of the silicon layer extends slightly beyond the contour of the silicon oxide layer 36. Then, a predetermined portion of the silicon oxide layer 36 is removed. (FIG. 3(D)). By this treatment, one remained portion of the silicon oxide layer 38 which covers a prospective base electrode wiring path in the boron diffused region 51 is separated from another remained portion of the silicon oxide layer 36 which covers a portion of the boron-diffused region 51 to be used as a current path for feeding forming current in the subsequent step. A part of the boron-diffused region 51 and the non-doped region 52 of the silicon layer are thereby exposed. (FIG. 3(D')). Then, the wafer is dipped in an electrolyte, solution of ethylene glycol saturated with ammonium borate, and then a voltage of +100V is constantly applied to the boron-diffused region 51 by way of the portion covered with the silicon oxide layer 36 to perform a constant voltage anodic oxidation. By this treatment, the exposed portion of the boron-doped region 51 is converted into a porous silicon oxide layer 39. In this step, although the non-doped region 52 of the polycrystalline silicon layer is exposed to the electrolyte solution, the anodic oxidation is not caused therein because an electric conductivity thereof is extremely low and the forming current does not flow therethrough. Meanwhile, the anodic oxidation of the exposed boron-diffused region 51 of a high electric conductivity in the polycrystalline silicon layer proceeds to the surface of the substrate. Then, the anodic oxidation is automatically interrupted, because this portion is insulated and separated from the forming current feed path. (FIG. 3(E)). At this stage, the forming current is sharply decreased, and accordingly the termination of the anodic oxidation described above can be detected with ease. Then, the wafer is subjected to a thermal oxidation treatment, thereby forming a stable silicon oxide layer 40 of a thickness of 0.1 micron on the boundary of the porous silicon oxide layer 39 formed by the anodic oxidation with the polycrystalline silicon layer and the single crystal silicon substrate. (FIG. 3(F)). In this treatment, a silicon oxide film is formed on the surface of the non-doped region 52 of the polycrystalline silicon layer, as well. However, the thickness of the silicon oxide film therein is extremely thin, as compared with the thickness of the other part. Therefore the surface of the non-doped region 52 can be exposed by utilizing a difference in the thickness. After the surface of the non-doped region 52 is exposed, boron is diffused therein down to the N type semiconductor substrate 31 by a thermal diffusion process, thus connecting this newly diffused P region 41 with the boron-diffused region 37 in the substrate to form a P type single crystal base region (FIG. 3(G)). After the formation of the base phosphorous is diffused through the exposed region 52 into the P type region 41 by a thermal diffusion process to form an N type single crystal emitter region 42. (FIG. 3(H)). Then, the silicon oxide layer is removed to uncover the surface of portions of the polycrystalline silicon layer connected to the base region 37 and to the emitter region 42 and platinum is deposited on the exposed surface to a thickness of 0.1 micron. Then the substrate is subjected to a heat treatment at 750° C for 10 minutes in a non-oxidizing atmosphere, thereby forming platinum silicide at the surface of the polycrystalline silicon layer which serves as a base electrode wiring path 43 and an emitter electrode wiring path 44, while the remaining platinum is removed with aqua regia. (FIG. 3(I)). Finally, metallic terminal electrodes 45, 46 for connecting the respective electrode wiring paths with external leads are formed, thus completing the manufacture of an NPN type transistor. (FIGS. 3(J), 3(J)').

While the description has been made far of the example of the method according to the present invention, the steps of the method will be enumerated as below:

1. A polycrystalline silicon layer is formed on a semiconductor substrate;

2. A first impurity is doped through a polycrystalline silicon layer into a semiconductor substrate region;

3. A periphery of a first impurity doped region is converted into a silicon oxide; and 4. A second impurity is doped through a non-doped or already doped polycrystalline silicon layer into a second semiconductor substrate region.

The advantage of the present invention is that the relative positions of electrodes led from two semiconductor regions separated by PN junction are controlled automatically, without resorting to an artificial pattern defining operation.

Although the embodiments are directed to manufacture of a single transistor, the invention can be applied to manufacture of an integrated circuit including a plurality of transistors and others circuit elements in a semiconductor chip. In such case, a doped polycrystalline layer connected to a single crystal region of a transistor can be used as an interconnection wiring extended to and connected to another single crystal region of another transistor or another circuit element.

The technical scope of the present invention should not be limited to the instances described, but covers all the methods of manufacture insofar as defined in the appended claims.

We claim:

1. A method of manufacturing a semiconductor device comprising the steps of forming a polycrystalline silicon layer over a major surface of a semiconductor substrate, introducing a first kind of impurity into a first portion of said polycrystalline silicon layer to its entire thickness, thereby providing a first doped region, coverting a peripheral of said first doped region into an insulator, and introducing a second kind of impurity into a second portion of said polycrystalline silicon layer to its entire thickness, thereby providing a second doped region, said first and second doped regions serving as electrical connection to regions in said semiconductor substrate.

2. The method of claim 1, wherein said step of converting the peripheral of said first doped region includes the steps of converting the polycrystalline silicon at said peripheral into porous silicon and oxidizing said porous silicon into silicon oxide.

3. The method of claim 2, in which said step of converting into porous silicon is performed by using an electrolyte solution of ethylene glycol saturated with ammonium borate.

4. The method of claim 1, in which said substrate is covered with an insulating layer and at least one opening is formed in said insulating layer through which said polycrystalline silicon layer directly contacts with said substrate.

5. A method of manufacturing a semiconductor device comprising the steps of providing a semiconductor substrate, forming an insulating film over the major surface of said substrate except for a predetermined portion thereof, depositing a polycrystalline silicon layer over said major surface of said substrate, diffusing one conductivity impurity into a first portion of said polycrystalline silicon layer to its entire thickness, covering the surface of said first diffused region except for a peripheral portion thereof with an insulating film, converting said peripheral portion into silicon oxide, diffusing the opposite conductivity type impurity into a second portion of said polycrystalline silicon layer to the depth exceeding the bottom of said second portion to form the opposite conductivity type region in said substrate.

6. The method of claim 5 further comprising the steps of exposing the surface of said first and second diffused regions, depositing a metal over the exposed surfaces, performing a heat treatment at a temperature sufficient for alloying said metal with said polycrystalline silicon layer in said first and second diffused regions and removing a non-alloyed portion of said metal.

7. A method of manufacturing a semiconductor device comprising the steps of providing a semiconductor substrate of one conductive type, forming the opposite conductive type region in said substrate, forming an insulating film over a major surface of said substrate except for predetermined portion thereof, depositing a polycrystalline silicon layer over said major surface, selectively diffusing an impurity of said opposite conductive type into a first portion of said polycrystalline layer over to its entire thickness down to the surface of said opposite conductive type region, covering said first portion except for over a peripheral portion thereof with a silicon oxide layer, selectively oxidizing said peripheral portion into an insulator of silicon oxide, and selectively diffusing an impurity of said one conductive type into a second portion of said polycrystalline layer.

* * * * *